United States Patent
Jones et al.

(10) Patent No.: US 6,363,095 B1
(45) Date of Patent: Mar. 26, 2002

(54) SOLID-STATE LASER SYSTEM USING HIGH-TEMPERATURE SEMICONDUCTOR DIODE LASER AS AN OPTICAL PUMP SOURCE

(75) Inventors: Ronald B. Jones, Mundelein; Michael A. Guy, McHenry; Gerald P. Griffith, Western Springs, all of IL (US); Ralph L. Burnham, Reston; Ti Chuang, Sterling, both of VA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 09/306,502

(22) Filed: May 6, 1999

(51) Int. Cl.[7] ............................................. H01S 3/0933
(52) U.S. Cl. ............................. 372/75; 372/34; 372/36
(58) Field of Search ............................. 372/75, 34, 36, 372/21, 13

(56) References Cited

U.S. PATENT DOCUMENTS

| | | | |
|---|---|---|---|
| 3,992,683 A | 11/1976 | Djeu et al. ................ | 331/94.5 |
| 4,230,995 A | 10/1980 | Burnham ................ | 331/94.5 |
| 4,295,104 A | 10/1981 | Burnham ................ | 331/94.5 |
| 5,117,126 A * | 5/1992 | Geiger ....................... | 372/22 |
| 5,181,211 A | 1/1993 | Burnham et al. ........... | 372/21 |
| 5,262,658 A | 11/1993 | Jankowski ................ | 257/88 |
| 5,329,539 A | 7/1994 | Pearson et al. ............. | 372/36 |
| 5,400,351 A | 3/1995 | Montgomery et al. ...... | 372/34 |
| 5,454,002 A | 9/1995 | McCann ................... | 372/36 |
| 5,488,626 A | 1/1996 | Heller et al. ............... | 372/70 |
| 5,515,391 A | 5/1996 | Endriz ...................... | 372/34 |
| 5,526,372 A | 6/1996 | Albrecht et al. ............ | 372/69 |
| 5,640,407 A | 6/1997 | Freyman et al. ............ | 372/36 |
| 5,717,712 A | 2/1998 | Swaminathan et al. ..... | 372/107 |
| 5,740,191 A | 4/1998 | Kasper et al. .............. | 372/34 |
| 5,754,574 A | 5/1998 | Lofthouse-Zeis et al. ... | 372/34 |
| 5,760,939 A | 6/1998 | Nagarajan et al. .......... | 359/161 |
| 5,832,015 A | 11/1998 | Goto et al. ................. | 372/34 |
| 5,875,206 A * | 2/1999 | Chang ...................... | 372/75 |
| 6,031,854 A * | 2/2000 | Ming ........................ | 372/22 |
| 6,043,456 A * | 3/2000 | Meyer et al. .............. | 372/34 |

* cited by examiner

*Primary Examiner*—James W. Davie
(74) *Attorney, Agent, or Firm*—Terry J. Anderson; Karl J. Hoch, Jr.

(57) ABSTRACT

A laser system for operation at elevated temperatures with minimal cooling requirements. The laser system comprises a laser media having first and second optical ends and an input port. The laser system further comprises at least one high-temperature laser diode which optically communicates with the laser media and is operative to generate a source beam of light which is transmitted into the input port of the laser media. Optically communicating with the first optical end of the laser media is at least one reflector, while optically communicating with the second optical end of the laser media is at least one optical coupler. The laser media, the reflector and the optical coupler are configured to form a laser resonator operative to generate a laser beam which is transmitted through the optical coupler.

28 Claims, 2 Drawing Sheets

SOLID-STATE LASER SYSTEM USING HIGH-TEMPERATURE SEMICONDUCTOR DIODE LASER AS AN OPTICAL PUMP SOURCE

CROSS-REFERENCE TO RELATED APPLICATIONS (Not Applicable)

STATEMENT RE: FEDERALLY SPONSORED RESEARCH/DEVELOPMENT (Not Applicable)

BACKGROUND OF THE INVENTION

The present invention generally relates to solid state laser systems, and more particularly to a laser system that uses high temperature laser diodes as an optical pumping source.

Solid-state laser systems have been recognized as an efficient method of producing laser light. In such systems, atoms present in a crystalline or glass host material or medium absorb light produced by an external pump source and thereby achieve an excited state to generate light at a known wavelength. The host laser medium is mounted in an optical cavity which provides the optical feedback necessary for proper laser action. The result is a simple and versatile laser which has become a standard tool for diverse applications.

The choice of the optical pump source (external light) to excite the laser medium strongly influences laser characteristics. The optical pump source can be chosen from a pulsed flash lamp, a continuous arc lamp or a semiconductor (diode) laser. Both flash lamp and continuous arc lamp pumping tend to be electrically inefficient and create significant amounts of waste heat since the spectral range of the lamp is much broader than the absorption range of the laser medium. Only a small portion of the light from these types of pump sources is absorbed by the laser medium, thereby creating an inefficient laser system.

On the other hand, laser diodes have been recognized as providing an efficient pump source in solid-state laser systems since the 1960's. When employed as a pump source, the laser diode is used to generate light which overlaps the spectral band of the laser medium. Optimally, the laser diode generates light in a narrow spectral regime that overlaps the primary absorption band of the laser medium, with the wavelength of the light generated by the laser diode being matched to the absorption region of the host laser medium. The laser diode is considered to be more efficient as a pump source than a flash lamp or an arc lamp since the light produced by the laser diode is more closely matched to the host laser medium.

Though providing advantages over alternative types of pump sources, the use of a laser diode as an optical pump source give rise to certain difficulties, most of which are attributable to the requirement to maintain precise thermal control of the laser diode for its proper operation. In those laser systems in which laser diodes have been employed, the laser diodes comprise continuous wave (CW) laser diodes which are operative to emit light at about 810 nm at ambient or room temperature. The proper operation of these laser diodes requires the precise thermal control thereof to maintain the temperature of the same at room temperature. Indeed, the wavelength of light produced by these laser diodes can shift at a rate of about 1 nm for every shift in temperature of 3° C. As a result, in order to maintain the operating temperature of these laser diodes at room temperature, those laser systems incorporating the same must be provided with components or systems such as thermal electric controllers, heat spreaders, and/or heat sinks for purposes of dissipating the heat generated by the operation of the laser diode(s). As will be recognized, if such generated heat is not fully dissipated, the resultant temperature increase within the laser diode(s) will result in the same emitting longer wavelengths of light which will not be optimally matched to the absorption region of the laser medium of the laser system.

As indicated above, in those prior art laser systems which include one or more laser diodes as the optical pump source, such laser diodes are adapted to optimally operate at room temperature. As a result, these prior art laser systems rely upon the inclusion of thermal electric cooling with large heat sinks and/or water cooling to maintain the room temperature operating conditions required by the laser diode(s) thereof. Also used in some of these prior art systems are silicon micro-channel coolers with low thermal impedance which are operative to extract heat from the laser diode junction(s). However, the need to provide the prior art laser systems with these and other types of cooling systems provides significant disadvantages due to such cooling systems requiring excessive amounts of energy to operate, typically being large in size, and further being complex in construction and therefore prone to failure.

There has recently been developed laser diodes that are specifically configured to operate at temperatures above room temperature, and more particularly at temperatures of at least about 70° C. These laser diodes are operable to generate light at a wavelength in the range of from about 800 to 812 nm at temperatures above 70° C. As such, in order for these high-temperature laser diodes to operate properly, they must necessarily be heated to a temperature level above ambient or room temperature. Indeed, the heat produced by these laser diodes as a result of their normal operation actually contributes to their ability to generate light of a precise wavelength. Thus, not only do such laser diodes typically not require extensive cooling for their proper operation, they actually must be heated to above room temperature for their proper operation to occur.

In the present invention, Applicant has recognized that many of the disadvantages present in prior art laser systems including laser diodes which must be maintained at room temperature could be eliminated if such laser diodes were to be replaced with those which are specifically suited to operate at elevated temperatures. In this respect, Applicant also recognized that in such a laser system, the need to include complex cooling systems or units would be avoided due to the high temperature operational thresholds of the laser diodes included therein. As such, the present invention provides a laser system which is capable of operating at elevated temperatures reliably without the need for or the inclusion of a complex cooling system for the laser diodes of the laser system.

BRIEF SUMMARY OF THE INVENTION

In accordance with the present invention, there is provided a laser system which is particularly suited to operate at elevated temperatures, thus eliminating the need to integrate an extensive cooling system thereinto. The laser system of the present invention comprises a laser media which defines first and second optical ends and an input port. In a preferred embodiment of the present invention, the laser media comprises a Nd:YAG laser media, though the same may alternatively comprise a Nd:YLF laser media. In addition to the laser media, the laser system includes a pair of identically configured, high-temperature laser diodes which are in optical communication with the laser media and operative to collectively generate a source beam of light which is transmitted into the input port of the laser media. Importantly, the laser diodes are specifically adapted to operate at a temperature of at least about 70° C., and to generate the source beam at a wavelength in the range of from about 800 nm to about 812 nm when in their optimal operating temperature range. Additionally, the laser diodes may be configured to operate in either a continuous wave mode or a pulse mode.

In addition to the laser media and laser diodes, the present laser system includes at least one reflector which is in optical communication with the first optical end of the laser media, and at least one optical coupler which is itself in optical communication with the second optical end of the laser media. The laser system may also include a Q-switch, such as an acoustic-optical modulator, which is in optical communication with the optical coupler. The laser media, the reflector and the optical coupler are configured to form a laser resonator operative to generate a laser beam which is transmitted through the optical coupler.

In addition to the above-described components, the present laser system preferably comprises a heater which is in conductive communication with the laser diodes for selectively heating the same to their minimum threshold of their prescribed operating temperature range. More particularly, when necessary, the heater facilitates the heating of the laser diodes to an operating temperature of at least about 70° C. which is required for the proper operation of the laser diodes. The heating of the laser diodes by the heater will typically occur upon the start-up of the laser system to elevate the temperature of the laser diodes to the required level. Additionally, the heater will sometimes be employed when the operating temperature of the laser diodes may fall below the 70° C. threshold as could occur when they are operated in a pulse mode. However, the natural tendency of the laser diodes to generate heat as a result of their normal operation is instrumental in maintaining the operating temperatures thereof at or at least close to the minimum threshold or level of about 70° C.

Though the laser diodes are configured to operate at a temperature of at least about 70° C., the proper operation of such diodes requires that the temperatures thereof do not exceed about 80° C. In those instances when the temperatures of the laser diodes may exceed 80° C. due to the operation thereof in a continuous wave mode, the laser system of the present invention is preferably provided with a simple cooling unit such as a fan which, when activated, is operative to reduce the temperature levels of the laser diodes to within their the preferred operating temperature range of from about 70° C. to about 80° C. Because the laser diodes in the present laser system are particularly suited to operate at elevated temperatures, and need only be cooled under limited circumstances, the need to include a complex cooling system or unit in the present laser system is avoided. Since known cooling systems are typically large in size, of substantial weight, require substantial energy, and are prone to failure, the elimination thereof from within the present laser system provides significant advantages in size reduction and operational efficiency.

Further in accordance with the present invention, there is provided a method of producing a laser beam through the use of a laser system which is capable of operating at high temperatures with minimal cooling requirements. The method comprises the initial step of producing a source beam of light through the use of at least one laser diode having a prescribed minimum operating temperature of at least about 70° C. The source beam of light is then transmitted into a laser media to produce a second beam which is itself reflected through the laser media via a reflector and an optical coupler to generate an output beam. The source beam of light may be produced via a pair of laser diodes, and in either a continuous wave mode or a pulse wave mode. As indicated above, the source beam of light is preferably produced so as to have a wavelength in the range of from about 800 to 812 nm.

BRIEF DESCRIPTION OF THE DRAWINGS

These as well as other features of the present invention, will become more apparent upon reference to the drawings wherein.

DETAILED DESCRIPTION OF THE INVENTION

Figure 1:
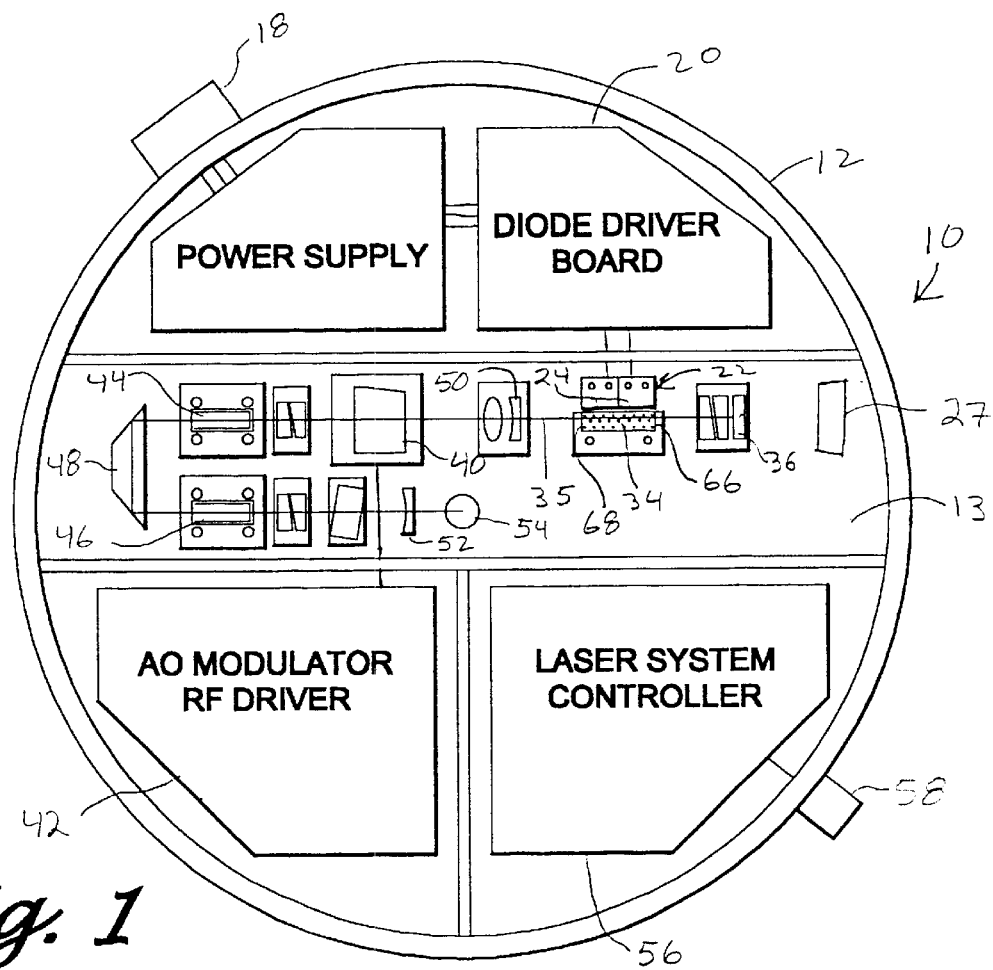
FIG. 1 is a top plan view of a laser system constructed in accordance with the preferred embodiment of the present invention.

Referring now to the drawings wherein the showings are for purposes of illustrating a preferred embodiment of the present invention only, and not for purposes of limiting the same, FIG. 1 depicts a laser system 10 which is capable of operating at elevated temperatures without requiring the inclusion of a complex or comprehensive cooling system or unit, such as a liquid cooling system often found in prior art laser systems. The laser system 10 comprises a housing 12 which accommodates the various components of the laser system 10 was will be described in more detail below. One of the primary structural support components of the laser system 10 is an optical bench 13 which is disposed within the housing 12 and has the majority of the optics of the laser system 10 secured thereto.

As seen in FIG. 1, the laser system 10 of the present invention comprises a power supply 16 which is disposed within the housing 12 and is adapted to receive external power via a power connector 18 disposed on an exterior surface of the housing 12. The power supply 16 may comprise either a DC to DC power convertor or an AC to DC power convertor that provides conditioned power to a diode array driver 20 of the laser system 10. In the preferred embodiment, the power supply 16 is a 200W unit that is capable of converting either 28V DC or 115V 400 Hz AC power to approximately 5V.

Figure 2:
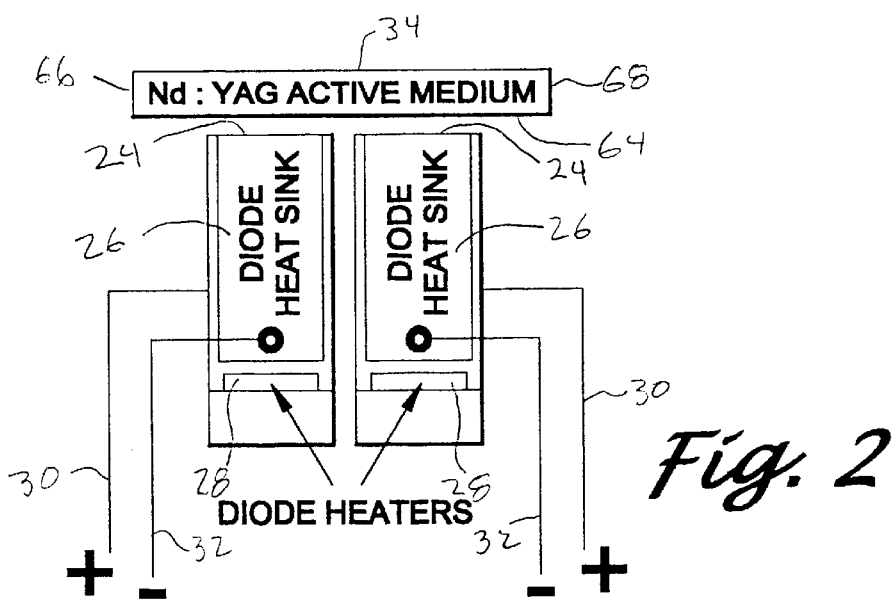
FIG. 2 is a top plan view of the high temperature diode array which functions as the optical pump source in the laser system shown in FIG. 1.

In the present laser system 10, the diode array driver 20 supplies pulsed electrical power to a diode array 22 which is disposed upon the optical bench 13 and is shown in FIG. 2. In the preferred embodiment, the pulsed electrical power supplied to the diode array 22 by the diode array driver 20 is at a duty cycle of up to about 50%. Typically, the diode array driver 20 provides 3.6V DC at a peak drive current of 60A which is the preferred operating requirement for the diode array 22. The diode array driver 20 supplies constant current to the diode array 22 using a set of power MOSFETS for purposes of switching energy stored within ceramic capacitors. The low impedance of the diode array 22 requires the use of several switching MOSFETS in parallel. The diode array driver 20 is capable of delivering pulse lengths from about 200 μs to about 2 ms with rise and fall times of around 5 μs. The output of the diode array driver 20 can be controlled through simple TTL logic pulses. Additionally, the diode array driver 20 is capable of providing overvoltage, overcurrent, overduty-cycle, overtemperature, and reverse bias protection for the diode array 22.

As previously indicated, the diode array driver 20 provides the operating current to the diode array 22. In the present laser system 10, the diode array 22 itself comprises a pair of identically configured elevated or high temperature laser diodes 24. As seen in FIG. 2, each of the laser diodes 24 is integrally connected to a respective one of an identically configured pair of diode heat sinks 26. Each laser diode 24 has a preferred operating temperature range of from about 70° C. to about 80° C. When operating within this preferred temperature range, each laser diode 24 emits light having a wavelength in the range of from about 800 nm to about 812 nm. The proper operation of each laser diode 24 requires that its temperature reach the minimum level or threshold of about 70° C. in the preferred operating temperature range. However, the heating of each laser diode 24 to a temperature exceeding about 80° C. detrimentally effects its operation, and the integrity of its output.

With regard to power requirements, each laser diode 24 requires about 15 to 40 watts of electrical energy. As will be recognized to those of ordinary skill in the art, the power requirements for each laser diode 24 may exceed 40 watts in the future. Additionally, each laser diode 24 can be used in a continuous wave (CW) mode of operation, or alternatively in a quasi-CW (pulsed) mode of operation. Preferred laser diodes 24 which may be employed in the present laser system 10 are manufactured by Spectra-Diode Labs (SDL) of San Jose, Calif. Though two laser diodes 24 are preferably used in the laser system 10, the total required number thereof is determined by the amount of power desired from the operation of the laser system 10 and the amount of power that can be supplied to each laser diode 24 thereof. If more power is desired from the laser system 10, then more than two laser diodes 24 will be integrated into the diode array 22.

The mounting of the laser diodes 24 to respective ones of the rectangularly configured heat sinks 26 is for purposes of maintaining the laser diodes 24 within their optimal operating temperature range of from about 70° C. to about 80° C. As will be recognized, the operation of each laser diode 24 results in the generation of heat, with the heat sinks 26 being used to prevent such heat generation from causing the operating temperatures of the laser diodes 24 to exceed the desired range (i.e., about 80° C.) too rapidly. However, since the laser diodes 24 must reach a minimum operating temperature level or threshold of about 70° C. in order to function properly, a diode heater 28 is preferably mounted to each heat sink 26 for purposes of selectively heating a respective one of the laser diodes 24. Each of the identically configured diode heaters 28 preferably comprises an electrical heater that is capable of heating a respective one of the laser diodes 24 to a temperature of or exceeding about 70° C. In the present laser system 10, once the heat generated by the operation of the laser diodes 24 results in the temperatures thereof falling within the desired operating temperature range (i.e., each diode reaches an operating temperature of at least about 70° C.), each of the diode heaters 28 may be turned-off or deactivated. The operation of each diode heater 28 is controlled by a thermal control system, the specifics of which will be described in more detail below. As further seen in FIG. 2, each laser diode 24 is supplied with electrical energy from the diode array driver 20 via a positive terminal 30 and a negative terminal 32.

As indicated above, each laser diode 24 generates light centered around the 800 nm to 812 nm regime when operating within the preferred temperature range. In the present laser system 10, this light emanating from the laser diodes 24 is transmitted or "pumped" into a solid-state laser media 34. The laser media 34 converts the source beam of light collectively generated by the laser diodes 24 to a second beam of light which is generated by the laser media 34 and is centered in around the 1.064 μm regime. The laser media 34 is preferably a Nd:YAG crystal that has an absorption band which is matched to the 800 nm to 812 nm regime of the light generated by the laser diodes 24 when the same are operating within their prescribed operating temperature range of from about 70° C. to about 80° C. As seen in FIG. 2, the source beam of light generated by the laser diodes 24 is directed into a side or input port 64 of the laser media 34 which has a generally rectangular configuration. It is contemplated that the laser media 34 may be fabricated from other types of solid-state gain media, such as Holumium (Ho), Thulium (Tm) and/or a Nd:YLF crystal, provided that such alternative media is used in conjunction with laser diodes which are adapted to generate light in the appropriate regime when operating in their prescribed elevated temperature range. In this respect, for the proper operation of the laser system 10 to occur, the laser diodes 24 employed in the diode array 22 must emit light of a wavelength which is in the absorption region of the laser media 34. As indicated above, the wavelength of the light emitted from the laser diodes 24 is closely matched to the absorption region of the laser media 34.

The laser media 34 of the present laser system 10 defines a first optical end 66 and an opposed second optical end 68. The second beam of light generated by the laser media 34 is emitted along a beam path 34 which protrudes from both the first and second optical ends 66, 68. This second beam is reflected back into the first optical end 66 by a first reflector 36 which is itself disposed upon the optical bench 13 in close proximity to the diode array 22, and in particular the laser media 34. The reflection of the second beam back into the laser media 34 along the beam path 35 facilitates the formation of a laser resonator which amplifies the power in the second beam in a manner which is currently known in the art.

After the power thereof has been amplified, the second beam is then directed through a Q-switch 40 which is also disposed upon the optical bench 13 in close proximity to the laser media 34. The Q-switch 40 may comprise an acoustic-optical (AO) modulator that is capable of controlling the transmission of the laser beam or output beam produced by the laser system 10. In the preferred embodiment, the Q-switch (AO modulator) 40 is electrically coupled to an RF driver 42 which is disposed within the housing 12. The RF driver 42 preferably comprises a solid-state RF oscillator which is matched to the tuned load of the Q-switch 40. The RF driver 42 delivers approximately 15W to the Q-switch 40 on a quasi-continuous basis. During non-lasing operations, RF power is applied to the Q-switch 40 to prevent the second beam from exiting the same. When an output pulse of laser energy is desired from the laser system 10, the RF power is discontinued to the Q-switch 40, thus allowing the output pulse to be generated by the laser system 10. The Q-switch 40 may be switched at repetition rates of from about 10 Khz to about 20 Khz in order to produce a corresponding modulation of the laser beam generated by the laser system 10.

In the present laser system 10, after the second beam has been transmitted through the first optical coupler 50 to the Q-switch 40, the output of the Q-switch 40 (i.e., the second beam) is directed to a first optical parametric oscillator (OPO) 44. The first OPO 44 is preferably a bulk KTP (potassium titanyl phosphate KTiOPO$_4$) OPO or a KTA (potassium titanyl arsenate) OPO that produces an output of about 1.54 $\mu$m. The first OPO 44 converts the second beam to a third beam which is generated or output therefrom and directed to a second OPO 46 via a prism 48. The prism 48 reflects the third beam so as to reduce the operational size of the laser system 10. The second OPO 46 is preferably a bulk silver gallium selenide (AgGaSe$_2$) OPO that achieves a mid-infrared output of about 4.0 $\mu$m and an idler beam with an output of about 2.5 $\mu$m. Both the first OPO 44 and the second OPO 46 are preferably positioned in an intercavity configuration wherein the second beam generated by the laser media 34 is directed through the first optical coupler and into the first OPO 44. Upon exiting the second OPO 46, the third beam (i.e., the converted second beam) is partially reflected by a second optical coupler 52 and partially transmitted therethrough. The reflected third beam then travels back through the second OPO 46, the prism 48, and the first OPO 44 where it is reflected back by the first optical coupler 50. The path of the third beam between the first and second optical couplers 50, 52 forms another resonator of the laser system 10 which itself is used to amplify the power of the output beam ultimately generated therefrom. Through the use of the above-described configuration, the brightness of the laser or output beam generated by the laser system 10 can exceed that of the laser media 34 by the amplification process which occurs within the laser system 10.

As indicated above, the second optical coupler 52 of the laser system 10 only partially reflects the third beam such that a portion of the third beam is transmitted through the second optical coupler 52. That portion of the third beam transmitted through the second optical coupler 52 comprises the output beam of the laser system 10 which is directed to an output aperture 54 within the housing 12 via a prism (not shown).

As further seen in FIG. 1, the operation of the laser system 10 is preferably controlled by a system controller 56 which is disposed within the housing 12 and directs the operation of the diode array driver 20, RF driver 42, and the power supply 16. In this respect, the system controller 56 controls and monitors the various functions of the laser system 10, and may include a single chip micro-controller that is capable of monitoring the output power of the laser system 10 and the function of the RF driver 42. The system controller 56 further provides a timing signal generator to synchronize the firing of the laser diodes 24 and RF driver 42 in order to generate the required pulse format of the output beam generated by the laser system 10. The system controller 56 is preferably in electrical communication with a signal connector 58 which is disposed on the exterior of the housing 12 and adapted to receive an input signal such as a fire command.

Figure 3:
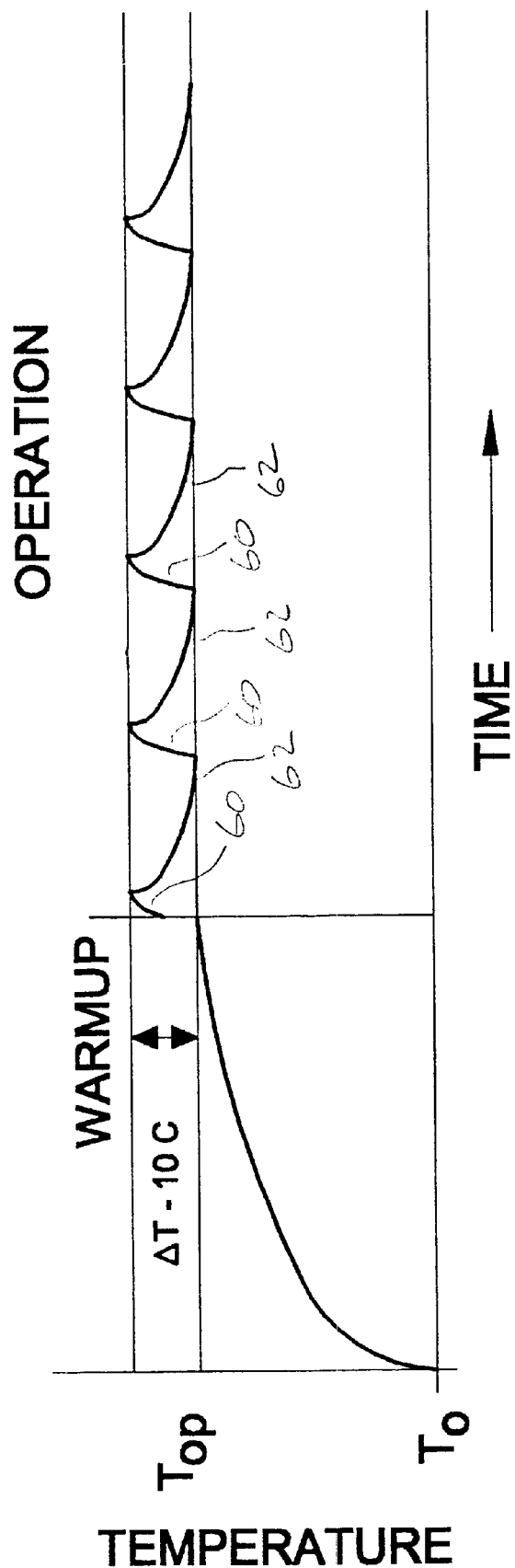
FIG. 3 is a graphical depiction of the operational temperature characteristics of the laser system shown in FIG. 1.

In addition to the foregoing, the system controller 56 of the laser system 10 also preferably contains a thermal control system (TCS) that monitors and controls the operating temperature of the laser system 10, and each laser diode 24 included therein. The TCS ensures that each high temperature laser diode 24 is operating within its prescribed temperature range. Specifically, during warm-up of the laser system 10, the TCS powers the diode heaters 28 until the temperature of each respective laser diode 24 is raised from ambient temperature $T_o$ to the lower temperature limit (i.e., about 70° C.) of its optimal operating temperature range $T_{op}$, as seen in FIG. 3. The laser diodes 24 of the laser system 10 will typically be maintained at their lower temperature limit within $T_{op}$ in a standby mode until a pulsing command is received by the system controller 56. Each diode heater 28 is preferably sized to raise the operating temperature of a respective laser diode 24 from ambient temperature $T_o$ to a temperature within $T_{op}$ in about 3.5 minutes. For example, the transmission of about 400W into a diode heat sink 26 having a mass of about 0.5 kg can raise the temperature thereof by about 100° C. in about 120 seconds.

The heat capacity of the heat sinks 26 of the diode array 22 allows the laser diodes 24 to be maintained in their optimal operating temperature range $T_{op}$ during pulsing of the laser system 10. Therefore, the TCS will supply power to each diode heater 28 as is necessary to maintain the laser diodes 24 at a temperature within $T_{op}$. For example, if $T_{op}$ has a spread of about 10° C. (i.e., the preferred operating temperatures of the laser diodes 24 fall within a range of about 10° C.) and the heat dissipation characteristics of each heat sink 26 result in a temperature increase in a respective laser diode 24 of approximately 1.5° C. during the 15 seconds that the laser diode 24 is typically pulsed on during operating of the laser system 10, the temperature of each laser diode 24 will be raised by only about 7.5° C. subsequent to the completion of 5 pulses thereof which is well within $T_{op}$ for the laser diodes 24. In FIG. 3, the laser system 10 is depicted as being operated in a manner wherein the same is pulsed on at the reference numeral 60 until the maximum value of $T_{op}$ is reached (i.e., about 80° C.), with each laser diode 24 then having a cooling period as labeled by the reference numeral 62. Once each laser diode 24 reaches its maximum operating temperature within $T_{op}$, as seen in FIG. 3, the TCS will allow the associated heat sink 26 to cool to the laser diode 24 to its minimum value within $T_{op}$ before pulsing is re-initiated.

In order to facilitate the cooling of each heat sink 26 after pulsing, a fan 27 is preferably provided within the housing 12 to direct ambient temperature air over the heat sinks 26. The fan 27 is controlled by the TCS and operated to cool not only each diode heat sink 26, but also the other components of the laser system 10 such as the first OPO 44 and second OPO 46. In order to facilitate the cooling thereof, each heat sink 26 is preferably insulated from the housing 12 and other components of the laser system 10 in order to improve heat transfer and regulation. Preferably, the laser system 10 has a maximum operating ambient temperature of about 55° C., with each laser diode 24 operating in the aforementioned preferred temperature range of from about 70° C. to about 80° C. such that there is a differential of from about 15° C. to about 25° C. As indicated above, the laser system 10 does not use any type of liquid cooling system for the diode array 22 since each laser diode 24 normally operates above ambient temperature, with only the heat that is generated during the operation of the laser diodes 24 being removed during the operation of the laser system 10.

Additional modifications and improvements of the present invention may also be apparent to those of ordinary skill in the art. For example, is it contemplated that various types of high temperature laser diodes 24 may be employed in the present laser system 10. Thus, the particular combination of parts described and illustrated herein is intended to represent only one embodiment of the present invention, and is not intended to serve as limitations of alternative devices within the spirit and scope of the invention.

What is claimed is:

1. A laser system for operation at elevated temperatures, comprising:

a laser media having a primary absorption band, a first optical end, a second optical end and an input port;

at least one high-temperature laser diode in optical communication with the laser media and configured to operate in a prescribed temperature range being greater than or equal to 70° C., the laser diode being operative to generate a source beam of light in a prescribed wavelength range being matched to the primary absorption band when operated within the prescribed temperature range, the source beam of light being transmitted into the input port;

at least one reflector in optical communication with the first optical end of the laser media;

at least one optical coupler in optical communication with the second optical end of the laser media;

an air cooling unit in fluid communication with the laser diode and operative to selectively circulate cooling air over the laser diode as needed to maintain the laser diode in the prescribed temperature range;

wherein the laser media, the reflector and the optical coupler are configured to form a laser resonator operative to generate a laser beam which is transmitted through the optical coupler.

2. The laser system of claim 1 wherein the laser diode is configured to operate in the temperature range of from about 70° C. to about 80° C.

3. The laser system of claim 2 wherein the laser diode is configured such that the wavelength of the source beam of light generated thereby is in the range of from about 800 nm to about 812 nm.

4. The laser system of claim 3 wherein the laser diode is configured to operate in a continuous wave mode.

5. The laser system of claim 3 wherein the laser diode is configured to operate in a pulse mode.

6. The laser system of claim 3 wherein the at least one laser diode comprises an array of laser diodes which collectively generate the source beam of light.

7. The laser system of claim 6 wherein the laser diodes are configured to operate in a continuous wave mode.

8. The laser system of claim 6 wherein the laser diodes are configured to operate in a pulse mode.

9. The laser system of claim 6 further comprising at least one heater in conductive communication with the laser diodes for selectively heating the laser diodes to a prescribed minimum operating temperature.

10. The laser system of claim 1 wherein the laser media is a Nd:YAG laser media.

11. The laser system of claim 1 further comprising a Q-switch in optical communication with the optical coupler.

12. The system of claim 11 wherein the Q-switch is an acoustic-optical modulator.

13. A laser system for operation at elevated temperatures, comprising:

at least one high temperature laser diode configured to operate in a prescribed temperature range being greater than or equal to 70° C., the laser diode being operative to generate a source beam of light having a wavelength in the range of from about 800 nm to about 812 nm when operated within the prescribed temperature range;

a laser media in optical communication with the laser diode matched to the wavelength of the source beam of light generated by the laser diode and operative to convert the source beam of light to a second beam which is generated therefrom and has a wavelength of about 1.064 $\mu$m;

a first parametric oscillator in optical communication with the laser media and operative to convert the second beam to a third beam which is generated therefrom and has a wavelength of about 1.54 $\mu$m;

a second parametric oscillator in optical communication with the first parametric oscillator and operative to convert the third beam to an output beam which is generated therefrom and has a wavelength of about 4.0 $\mu$m; and an air cooling unit in fluid communication with the laser diode and operative to selectively circulate cooling air over the laser diode as needed to maintain the laser diode in the prescribed temperature range.

14. The laser system of claim 13 wherein the laser diode is configured to operate in the temperature range of from about 70° C. to about 80° C.

15. The laser system of claim 14 wherein the first parametric oscillator is a non-linear $KTiOPO_4$ crystal and the second parametric oscillator is an $AgGaAs_2$ crystal.

16. The laser system of claim 14 wherein the laser media is a Nd:YAG laser media.

17. The laser system of claim 14 further comprising a Q-switch disposed between the laser media and the first parametric oscillator to regulate the transmission of the second beam between the laser media and the first parametric oscillator.

18. The laser system of claim 17 wherein the Q-switch is an acoustic-optical modulator.

19. The laser system of claim 14 wherein the at least one laser diode comprises a pair of laser diodes which collectively generate the source beam of light.

20. The laser system of claim 19 wherein the laser diodes are configured to operate in a continuous wave mode.

21. The laser system of claim 19 wherein the laser diodes are configured to operate with a duty cycle in the range of from about 25% to about 50%.

22. The system of claim 19 further comprising at least one heater in conductive communication with the laser diodes for selectively heating the laser diodes to a prescribed minimum operating temperature.

23. A method of producing a laser beam through the use of a laser system which is capable of operating at high temperatures with minimal cooling requirements, the method comprising the steps of:

a) generating a source beam of light with a laser diode having an operating temperature in the range of from about 70° C. to about 80° C.;

b) transmitting the source beam of light into a laser media to generate a second beam;

c) reflecting the second beam through the laser media with a reflector and an optical coupler to generate an output beam; and d) circulating cooling air over the laser diode via a cooling unit when the temperature of the laser diode exceeds about 80° C.

24. The method of claim 23 wherein step (a) comprises generating the source beam of light via a pair of laser diodes.

25. The method of claim 23 wherein step (a) comprises generating the source beam of light to have a wavelength in the range of from about 800 nm to about 812 nm.

26. The method of claim 23 wherein step (a) comprises generating the source beam of light in a continuous wave mode.

27. The method of claim 23 wherein step (a) comprises generating the source beam of light in a pulsed wave mode.

28. The method of claim 23 wherein step (a) comprises heating the laser diodes to a prescribed minimum operating temperature.

* * * * *